(12) United States Patent
Sunaga

(10) Patent No.: US 6,778,567 B2
(45) Date of Patent: Aug. 17, 2004

(54) OPTICAL TRANSMITTER

(75) Inventor: Yoshinori Sunaga, Tokyo (JP)

(73) Assignee: Hitachi Cable, Ltd., Tokyo (JP)

( * ) Notice: Subject to any disclaimer, the term of this patent is extended or adjusted under 35 U.S.C. 154(b) by 33 days.

(21) Appl. No.: 10/346,171

(22) Filed: Jan. 17, 2003

(65) Prior Publication Data

US 2004/0141535 A1 Jul. 22, 2004

(51) Int. Cl.[7] .............................................. H04B 10/04
(52) U.S. Cl. ................. 372/29.02; 372/29.021
(58) Field of Search .................. 372/29.02, 29.021; 398/197, 200

(56) References Cited

U.S. PATENT DOCUMENTS 5,706,117 A * 1/1998 Imai et al. .................. 398/197

FOREIGN PATENT DOCUMENTS

JP 01179484 A * 7/1989

* cited by examiner

Primary Examiner—David Vu
(74) Attorney, Agent, or Firm—Foley & Lardner LLP

(57) ABSTRACT

An optical transmitter having a packaging structure by which excellent optical transmitting waveform at high speed transmission is provided. An optical transmitter, comprising, a stem formed almost coaxial shape, a column fixed on said stem, a light emitting element chip provided on the column, terminals insulated with said stem and provided through the stem, and a connecting article connecting between the terminal and said light emitting element chip, wherein, the connecting article is formed by a line which is provided on an insulating substrate and is controlled to have predetermined characteristic impedance, and a resistive element for impedance matching connected to the line serially.

12 Claims, 5 Drawing Sheets

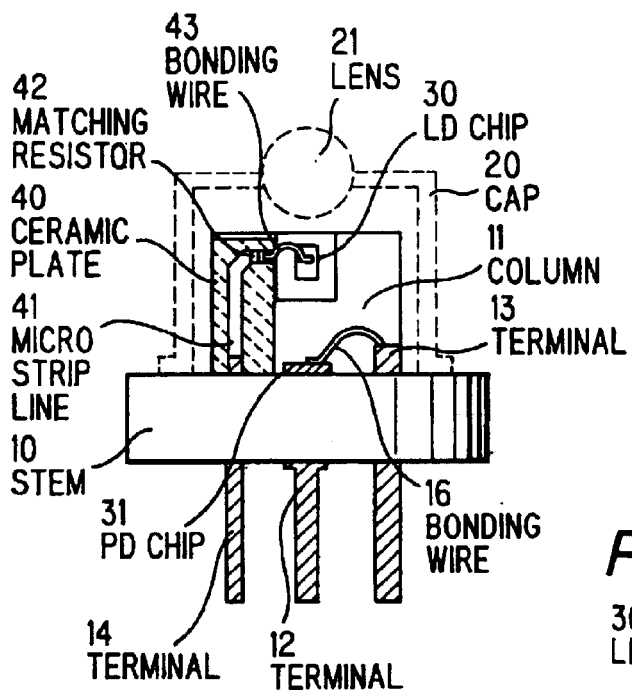
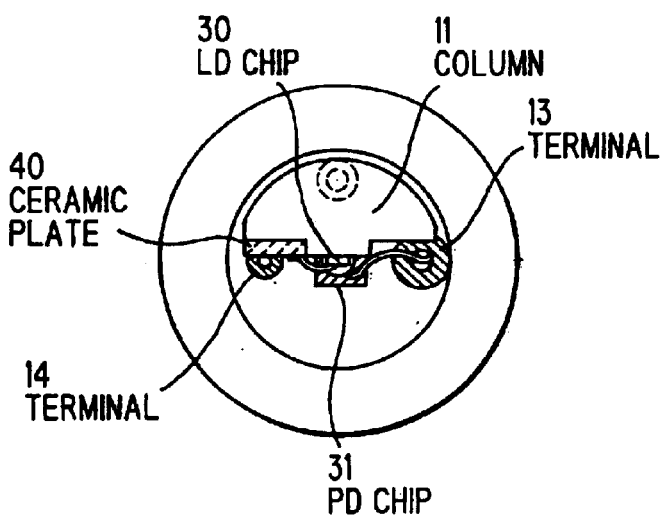
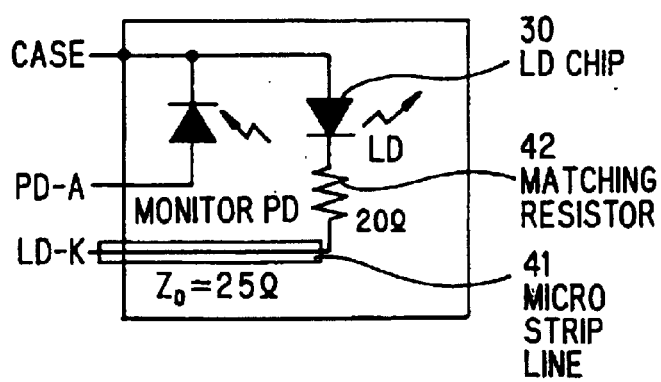

OPTICAL TRANSMITTER

BACKGROUND OF THE INVENTION

1. Field of the invention

The present invention relates to an optical transmitter for use in an optical transmission system, and more specifically to an optical transmitter provided with a packaging structure by which excellent optical transmitting waveform at high speed transmission can be obtained.

2. Prior Art

Recently, an optical transmission technique has become to be used commonly in data communicating system, therefore, an optical transceiver which is a key device of an optical transmission has become to be used in large quantities.

On the other hand, since transmitting speed required to an optical transceiver has become to be high more and more, in future, it seems that an optical transceiver having transmitting speed 10 Gbit/s or more than 10 Gbit/s will become to be used commonly in large quantities. Therefore, techniques to realize high speed transmitting with low cost are required strongly more than former.

To obtain a high speed optical transmitter, speed up of an optical element itself such as laser diode (LD) or outside modulator is important, but packaging method of an optical element is one of key points, too. Namely, it is necessary to devise a packaging structure which can obtain excellent optical transmitting waveform at high speed transmission, and to make it a realizable structure with low cost.

In FIG. 1(a), a front view of a conventional optical transmitter is shown, and in FIG. 1 (b), a plane view of it is shown.

AD shown in FIG. 1(a) and in FIG. 1(b), a conventional optical transmitter comprising mainly, the LD chip 30 which outputs light: the semicylindrical column 11 provided on its side with an overhang potion having supporting surface of the LD chip 30, the disk stem 10 supporting the LD chip 30 vertically to coincide the optical axis of the LD chip 30 with the axis of the optical fiber to which output light it input, and three terminals 12, 13 and 14 provided through the stem 10. Further, either electrode of the LD chip 30 is connected with the drive terminal 14 by a bonding wire 15, and another electrode of the Lo chip 30 is connected electrically with the common terminal 13 through the conductive stem 10 and column 11.

Further more, the optical transmitter is provided with the monitoring PD chip 31 which monitors emitting power of output light from the LD chip 30, on the stem 10 locating under the overhang potion, either electrode of the monitoring PD chip 31 is connected with the PD terminal 12, and another electrode of the monitoring PD chip 31 is connected with the common terminal 13 by a bonding wire 16.

These articles provided on the stem 10 are covered by the cap 20 equipped upper of it with the lens 21 which passes output light from the LD chip 30.

The above explained packaging structure is, at present, the most generally used package of light emitting element, and is called TO can package.

The stem 10 and the cap 20 are formed by metal, and the LD chip 30 is shielded hermetically, therefore, the package is very reliable.

Further, since the package has already been used enormously, automatic assembling is progressing and exceeding in cost.

Further more, since this package is coaxial in shape and emits light to axial direction, it can be applied easily to a receptacle type optical transmitter to which an optical connector is inserted directly.

However, in the conventional technique, because the connection between the LD chip 30 and the drive terminal 14 is made by wire bonding 15, the bonding wire 15 causes parasitic inductance which lowers transmitting speed. Although length of the bonding wire 15 is designed to be as short as possible, but limitation to shorten the length is existing, problem has been arisen that it is difficult to catch up with demand for high speed transmission more and more recently.

Further, this parasitic inductance causes disturbance of frequency characteristic, it makes speedup difficult more and more to provide resistance outside of the package so as to dump the disturbance.

Further more, since parasitic inductance of the bonding wire is varies according to a degree of strain or so on, as shown in FIG. 2, impedance between the LD chip 30 and the drive terminal 14 varies with every product, there is disadvantage that deteriorates reproducibility and causes to lower yield rate.

Except TO can package, various devises has been made to improve high frequency characteristic, there is a great problem that cost is very expensive.

Recently, receptacle type optical transmitter with easy handling is required strongly for high speed optical transmitter, there has not been realized TO can package applicable to such optical transmitter that operates at high speed.

As described above, conventional packaging method of light emitting element is required to improve stability of wideband characteristic and frequency characteristic.

SUMMARY OF THE INVENTION

An object of the present invention is to provide an optical transmitter provided with reduced parasitic inductance by shortening bonding wire, and high speed transmission and stable frequency characteristic with low cost.

In accordance with this invention, there is provided an optical transmitter, comprising, a stem formed almost coaxial shape, a column fixed on said stem, a light emitting element chip provided on said column, terminals insulated with said stem and provided through said stem, and a connecting article connecting between said terminal and said light emitting element chip, wherein, said connecting article is formed by a line which is provided on a insulating substrate and is controlled to have predetermined characteristic impedance, and a resistive element for impedance matching connected to said line serially.

In accordance with this invention, there is provided an optical transmitter, wherein, said resistive element for impedance matching is provided with matching resistor formed directly on said insulating substrate or chip resistor.

In accordance with this invention, there is provided an optical transmitter, wherein, a branched wiring is provided from middle of said matching resistor or chip resistor and said light emitting element chip, and said branched wiring is connected with a terminal which is connected electrically with outside.

In accordance with this invention, there is provided an optical transmitter, wherein, said branched wiring is provided with at least resistor and inductor so as to attenuate high frequency signal.

In accordance with this invention, there is provided an optical transmitter, wherein, diameter of said terminal, diameter of a hole formed through said stem to pass said terminal, and dielectric constant of insulator which is embedded to fix said terminal within said hole are controlled to make almost equalize characteristic impedance of said line with impedance of said terminal.

In accordance with this invention, there is provided an optical transmitter, wherein, sum of impedance of said light emitting element chip and impedance of said matching resistor or said chip resistor equals characteristic impedance of said line.

In accordance with this invention, there is provided an optical transmitter, comprising, a stem formed almost coaxial shape, a column fixed on said stem, an outside modulating element provided on said column, terminals insulated with said stem and provided through said stem, and a connecting article connecting between said terminal and said outside modulating element, wherein, said connecting article is formed by a line which is provided on a insulating substrate and is controlled to have predetermined characteristic impedance, and a resistive element for impedance matching connected to said line serially.

In accordance with this invention, there is provided an optical transmitter, wherein, said resistive element for impedance matching is provided with matching resistor formed directly on said insulating substrate or chip resistor.

In accordance with this invention, there is provided an optical transmitter, wherein, a branched wiring is provided from middle of said matching resistor or chip resistor and said light emitting element chip, and said branched wiring is connected with a terminal which is connected electrically with outside.

In accordance with this invention, there is provided an optical transmitter, wherein, said branched wiring is provided with at least resistor and inductor so as to attenuate high frequency signal.

In accordance with this invention, there is provided an optical transmitter, wherein, diameter of said terminal, diameter of a hole formed through said stem to pass said terminal, and dielectric constant of insulator which is embedded to fix said terminal within said hole are controlled to make almost equalize characteristic impedance of said line with impedance of said terminal.

In accordance with this invention, there is provided an optical transmitter, wherein, sum of impedance of said outside modulating element and impedance of said matching resistor or said chip resistor equals characteristic impedance of said line.

BRIEF DESCRIPTION OF THE DRAWINGS

The invention will be explained in more detail in conjunction with the appended drawings, wherein;

FIG. 3(a) is a front view showing an embodiment of an optical transmitter of the present invention.

FIG. 3(b) is a plane view showing an embodiment of an optical transmitter of the present invention.

FIG. 4 is a circuit diagram showing an embodiment of an optical transmitter of the present invention.

DESCRIPTION OF THE PREFERRED EMBODIMENTS

Figure 1A:
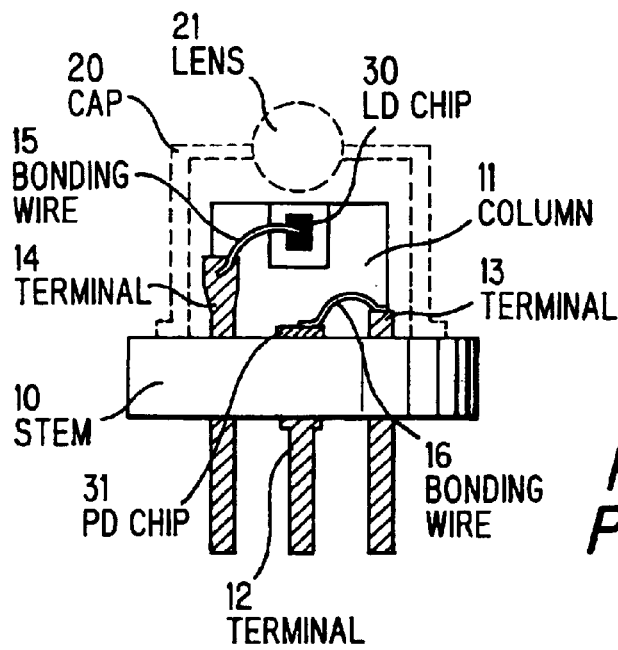
FIG. 1(a) is a front view showing a conventional optical transmitter.
Figure 1B:
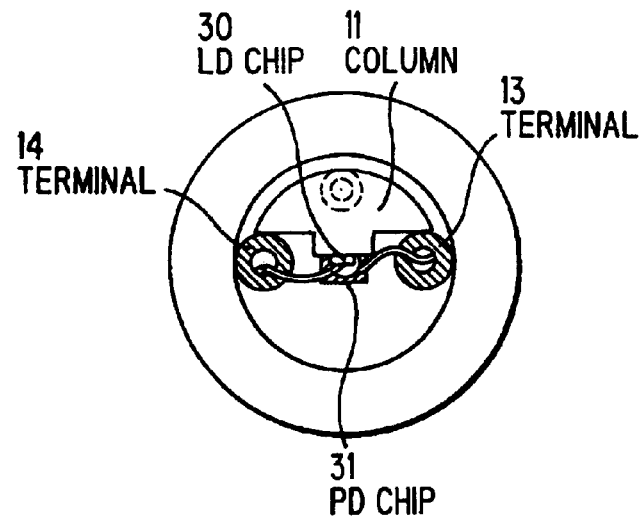
FIG. 1(b) is a plane view showing a conventional optical transmitter.
Figure 2:
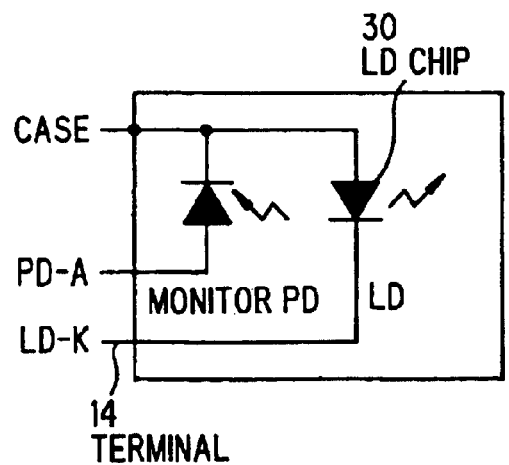
FIG. 2 is a circuit diagram showing a conventional optical transmitter.

Preferred embodiments of the present invention will be explained in conjunction with accompanying drawings.

In FIG. 3(a), a front view of inside of optical transmitter in accordance with this embodiment is shown, and in FIG. 3(b), a plane view of it is shown.

As shown in FIG. 3(a) and FIG. 3(b), optical transmitter comprising mainly, the LD chip 30 which outputs light, the semicylindrical column 11 provided on its side with an overhang potion having supporting surface of the LD chip 30, the disk stem 10 supporting LD chip 30 vertically to coincide the optical axis of the LD chip 30 with the axis of the optical fiber to which output light is input, and three terminals 12, 13 and 14 provided through the stem 10.

The ceramic plate 40 is bonded to side of the column 11 almost parallel with the LD chip 30, and the micro strip line 41 which is connected with the drive terminal 14 is provided on the ceramic plate 40. This micro strip line 41 is controlled to have characteristic impedance about 25 Ω.

Further, an impedance matching resistive element is connected to this micro strip line 41 serially. This impedance matching resistive element comprising, the matching resistor 42 having impedance about 20 Ω and the short bonding wire 43 connecting between the matching resistor 42 and either electrode of the LD chip 30. The matching resister 42 is formed on the ceramic plate 40 directly by printing or so on.

Another electrode of the LD chip 30 is connected electrically with the common terminal 13 through the conductive stem 10 and column 11.

Diameter of the drive terminal 14, diameter of the hole formed through the stem 10 to pass the drive terminal 14, and dielectric constant of insulator which is embedded between the drive terminal 14 and the hole and fixing the drive terminal 14 within the hole are formed to equalize characteristic impedance of the micro strip line 41 with impedance of the drive terminal 14. Impedance of the drive terminal 14 itself is controlled as well as coaxial line.

Further, this optical transmitter is provided with the monitor PD chip 31 which monitors emitting power of output light from the LD chip 30, on the stem 10 locating under the overhang potion. And either electrode of the monitor PD chip 31 is connected with the PD terminal 12, and another electrode of the monitor PD chip 31 is connected with the common terminal 13 by a bonding wire 16.

These articles provided on the stem 10 are covered by the cap 20 equipped upper of it with the lens 21 which passes output light from the LD chip 30, and the LD chip 30 is shielded hermetically.

Operation of the optical transmitter in accordance with this embodiment will be explained.

Since the micro strip line 41 is formed that the length is controlled to reach the neighbor of the LD chip 30 in accordance with mounting height of the LD chip 30, length of the bonding wire 43 is shortened greatly comparing with the conventional optical transmitter.

Accordingly, it becomes possible to decrease parasitic inductance, and to realize high speed operation.

As shown in FIG. 4, since impedance of the LO chip 30 is about 5 Ω, matching with the micro strip line 41 having characteristic impedance 25 Ω can be obtained by connecting serially the matching resistor 42 having 20 Ω.

As explained above, in the conventional optical transmitter, impedance matching for wiring within package had been impossible, but in the present invention, impedance matching near the LD chip 30 became possible.

Therefore, it became possible to make frequency characteristic flat and variation of frequency characteristic small.

Characteristic impedance of the micro strip line 41 is not limited to 25 Ω, other value may be applicable so long as matching can be obtained. Further, it is possible to shift matching intentionally to vary frequency characteristic.

In this embodiment, connecting between the micro strip line 41 and the LD chip 30 is made by short bonding wire 43, instead of this, if height of the micro strip line 41 and the upper surface of the LD chip 30 is almost same, direct bridging using chip resistor maybe applicable. In this case, matching resistor 42 is not needed.

According to this constitution, parasitic inductance can be reduced still more.

In addition, in this embodiment, micro strip line is used as a line formed on insulating plate, other line such as coplanar line or strip line may be applicable so long as characteristic impedance is controlled within predetermined value.

Other embodiment of the present invention will be explained.

Figure 5A:
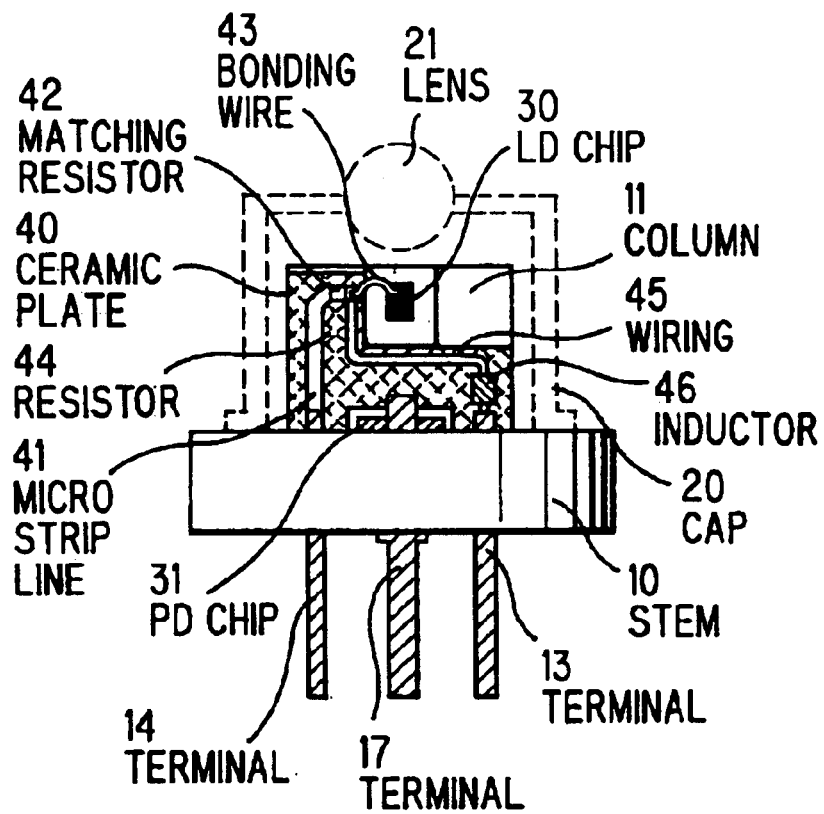
FIG. 5(a) is a front view showing another embodiment of an optical transmitter of the present invention.
Figure 5B:
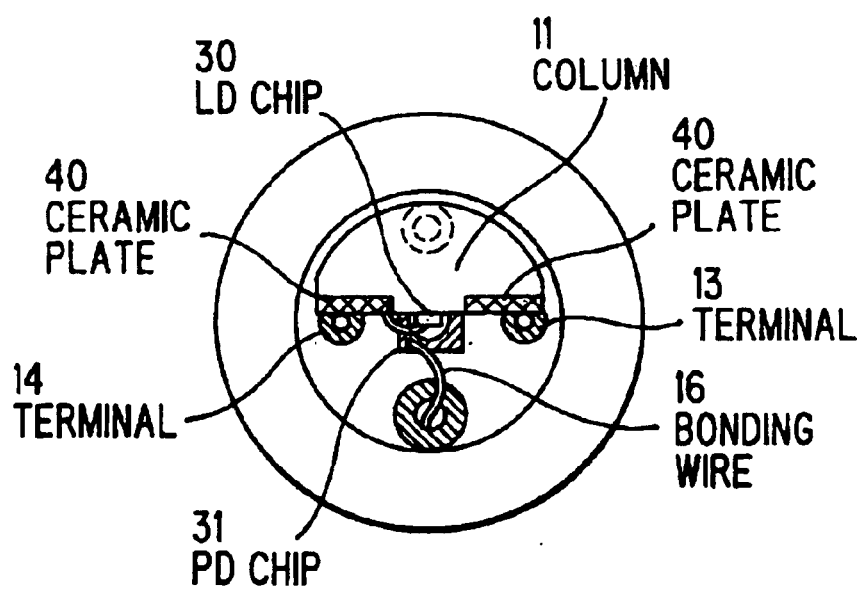
FIG. 5(b) is a plane view showing another embodiment of an optical transmitter of the present invention.

FIG. 5(a) shows a front vies of optical transmitter in accordance with another embodiment of the present invention, FIG. 5(b) shows a plane view of it, and rig. 6 shows circuit diagram.

As shown in FIG. 5(a), this optical transmitter, adding constitution shown in FIG. 3(a), is provided with the wiring 45 which draws to outside of the package from middle of the watching resistor 42 and LD chip 30 and is connected with outside through the terminal 17. At the middle of the wiring 45, the resistor 44 and the inductor 46 are provided.

Figure 6:
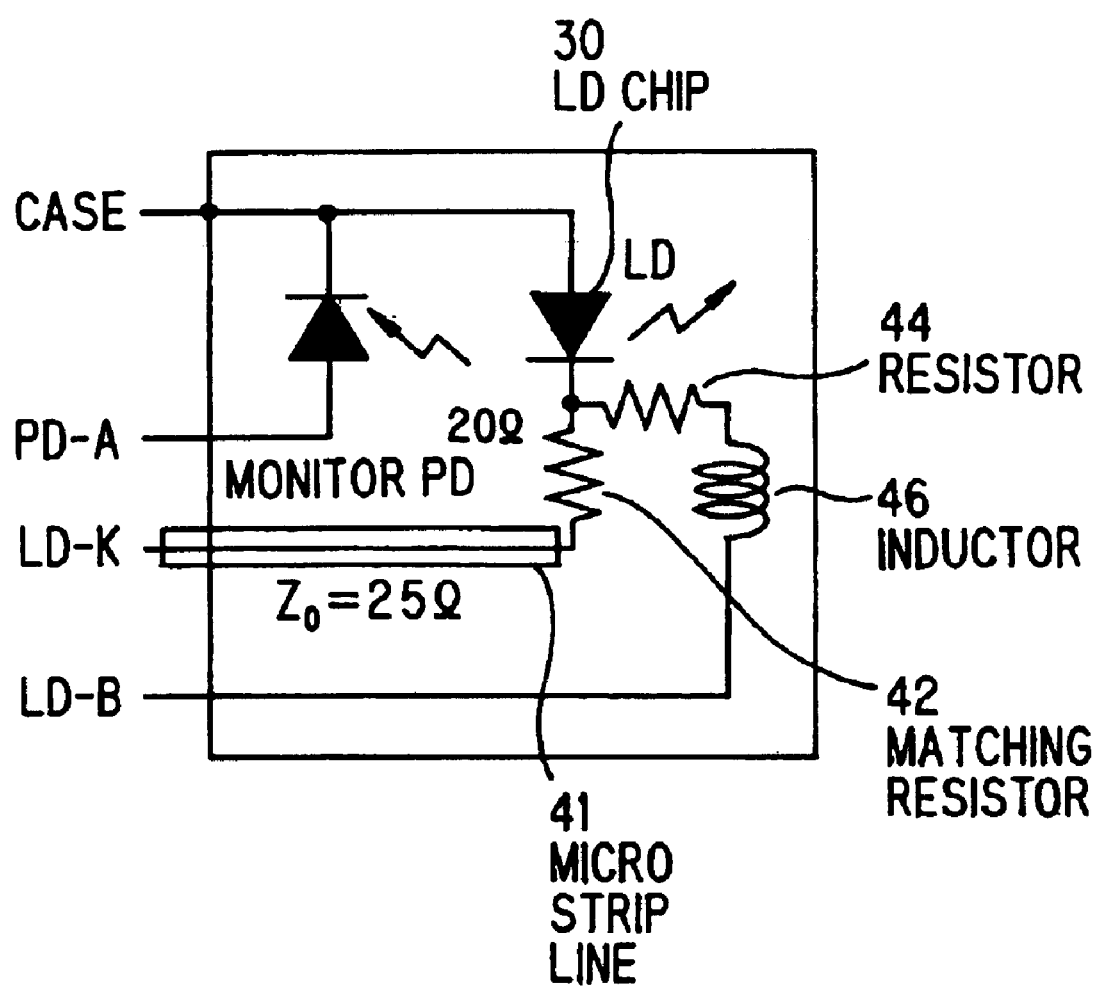
FIG. 6 is a circuit diagram showing another embodiment of an optical transmitter of the present invention.

Usually, the LD chip 30 is driven by superposing modulating current on bias current. Imposing bias current on the drive terminal 14 possible, but it is disadvantageous for the LD driving circuit because the bias current which flows through the matching resistor 42 heightens applying voltage. Therefore, as shown in FIG. 6, if the wiring 45 which enables to apply the bias current without passing through the matching resistor 42 is provided within the package, high and stable operation becomes possible.

In addition, the resistor 44 and the inductor 46 are inserted to prevent deterioration of modulating current waveform which flows LD chip 30 through the wiring 45.

The structure as explained above can be obtained by packaging ceramic substrate within one package, and other articles can be assembled by same method as conventional TO can package.

Accordingly, increase of manufacturing costs of this optical transmitter can be held low. Therefore, since advantages of TO can package that is used for conventional low speed and cheap optical transmitter can be applied as it is to very high speed optical transmitter, big cost lowering of high speed optical transmitter can be achieved.

In addition, in the embodiment, the ceramic substrate 40 is used as a dielectric substrate, material of the dielectric substrate is not limited so long as high frequency characteristic is satisfied.

Figure 7:
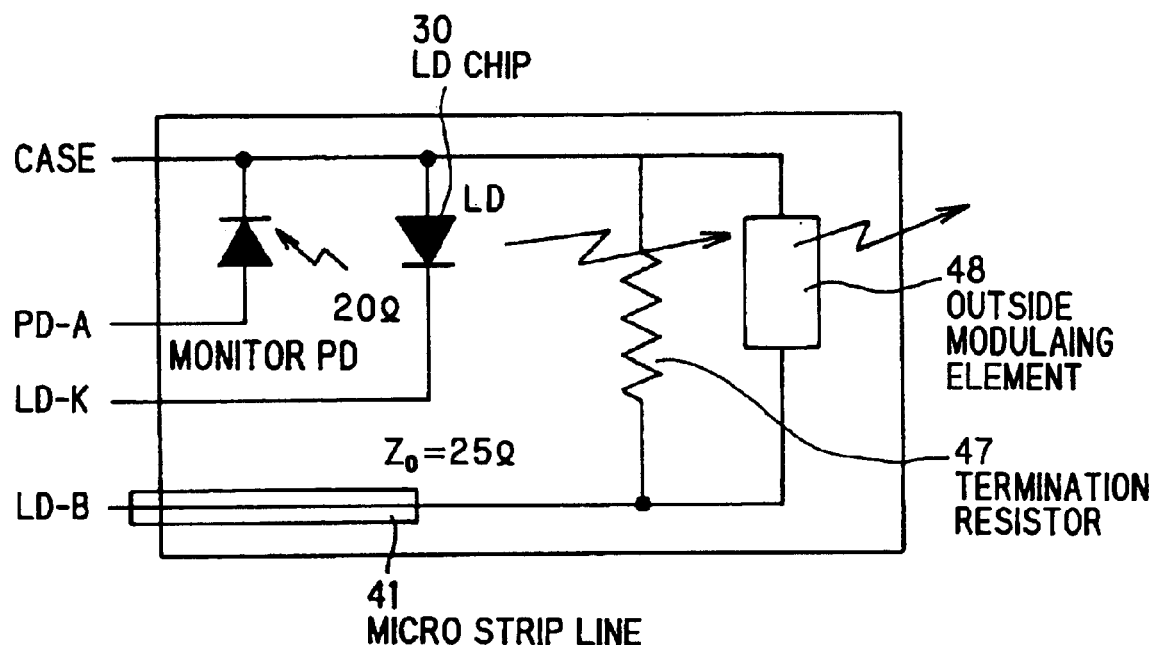
FIG. 7 is a circuit diagram showing another embodiment of an optical transmitter of the present invention.

FIG. 7 is showing a circuit diagram in accordance with another embodiment of the present invention, In this embodiment, the termination resistor 47 and the outside modulating element 48 are provided near the LD chip 30, and output light from the LD chip 30 is emitted through the outside modulating element 48. The micro strip line 41 is connected to the outside modulating element 48. In the figure, the terminal resistor 47 is provided paralelly with the outside modulating element 4B, but not limited to this, the terminal resistor 47 may be connected serially with the outside modulating element 40. An element which integrated a LD chip and an outside modulating element may be used in this embodiment. Not shown in the figure, the outside modulating element 48 is provided on the column 11 within the cap 20. In accordance with this embodiment which provided the outside modulating element 48 near the LD chip 30, distortion of waveform during high speed communication may be improved.

As described above in detail, according to the present invention, a high speed optical transmitter with low costs and stable characteristic can be obtained.

Although the invention has been described with respect to specific embodiment and clear disclosure, the appended claims are not to be thus limited but are to be construed as embodying all modification and alternative constructions that may be occurred to one skilled in the art which fairly fall within the basic teaching herein set forth.

What is claimed is:

1. An optical transmitter, comprising, a stem formed almost coaxial shape, a column fixed on said stem, a light emitting element chip provided on said column, terminals insulated with said stem and provided through said stem, and a connecting article connecting between said terminal and said light emitting element chip, wherein:

said connecting article is formed by a line which is provided on an insulating substrate and is controlled to have predetermined characteristic impedance, and a resistive element for impedance matching connected to said line serially.

2. An optical transmitter, according to claim 1, wherein:
said resistive element for impedance matching is provided with matching resistor formed directly on said insulating substrate or chip resistor.

3. An optical transmitter, according to claim 2, wherein:
a branched wiring is provided from middle of said matching resistor or chip resistor and said light emitting element chip, and said branched wiring is connected with a terminal which is connected electrically with outside.

4. An optical transmitter, according to claim 3, wherein:
said branched wiring is provided with at least a resistor and an inductor so as to attenuate high frequency signal.

5. An optical transmitter, according to claim 1, wherein:
diameter of said terminal, diameter of a hole formed through said stem to pass said terminal, and dielectric constant of insulator which is embedded to fix said terminal within said hole are controlled to make almost equal characteristic impedance of said line with impedance of said terminal.

6. An optical transmitter, according to claim 3, wherein:
sum of impedance of said light emitting element chip and impedance of said matching resistor or said chip resistor equals characteristic impedance of said line.

7. An optical transmitter, comprising, a stem formed almost coaxial shape, a column fixed on said stem, a light emitting element chip provided on said column, an outside modulating element provided on said column and near said light emitting element, terminals insulated with said stem and provided through said stem, and a connecting article connecting between said terminal and said outside modulating element, wherein:

said connecting article is formed by a line which is provided on a insulating substrate and is controlled to have predetermined characteristic impedance, and a resistive element for impedance matching connected to said line serially.

8. An optical transmitter, according to claim 7, wherein:

said resistive element for impedance matching is provided with matching resistor formed directly on said insulating substrate or chip resistor.

9. An optical transmitter, according to claim 8, wherein;

a branched wiring is provided from middle of said matching resistor or chip resistor and said light emitting element chip, and said branched wiring is connected with a terminal which is connected electrically with outside.

10. An optical transmitter, according to claim 8, wherein:

said branched wiring is provided with at least a resistor and an inductor so as to attenuate high frequency signal.

11. An optical transmitter, according to claim 7, wherein:

diameter of said terminal, diameter of a hole formed through said stem to pass said terminal, and dielectric constant of insulator which is embedded to fix said terminal within said hole are controlled to make almost equal characteristic impedance of said line with impedance of said terminal.

12. An optical transmitter, according to claim 8, wherein:

sum of impedance of said outside modulating element and impedance of said matching resistor or said chip resistor equals characteristic impedance of said line.

* * * * *